Dec. 21, 1965 J. H. PHELPS 3,225,309

PULSE WAVE GENERATOR WITH INDEPENDENT CONTROL OF PULSE REPETITION FREQUENCY AND DUTY CYCLE

Filed Dec. 5, 1963

INVENTOR.
J. H. PHELPS

BY Wake Lounty
ATTORNEY
and
James S. Shannon
AGENT

United States Patent Office 3,225,309

Patented Dec. 21, 1965

3,225,309

PULSE WAVE GENERATOR WITH INDEPENDENT CONTROL OF PULSE REPETITION FREQUENCY AND DUTY CYCLE

John H. Phelps, Liverpool, N.Y., assignor to the United States of America as represented by the Secretary of the Air Force Filed Dec. 5, 1963, Ser. No. 328,438
1 Claim. (Cl. 331—111)

In certain telemetry and guidance systems it is desirable to encode transducer data or control commands by varying the repetition frequency of a pulse wave for one channel of information and the pulse composition or duty cycle for a second channel of information. It is the object of this invention to provide a simple transistorized pulse wave generator with independent control of pulse repetition frequency and duty cycle for use in such systems.

Briefly, the pulse wave generator comprises a constant amplitude variable frequency sawtooth wave generator of the R-C relaxation oscillator type using a unijunction transistor to give a very rapid capacitor discharge. Varying R controls the frequency of the wave. The sawtooth wave is then applied to a network the output of which is limited to a predetermined value above and an equal value below an adjustable reference voltage, the oscillations between these two limits constiuting the desired pulse wave. Varying the reference voltage controls the duty cycle of the wave. The analog inputs to the two information channels of the generator are therefore the R in the relaxation oscillator and the reference voltage which independently control the frequency and duty cycle, respectively. Because of the sawtooth voltage, the pulse wave as first generated is not entirely rectangular but can be made rectangular if desired by a sufficient amount of clipping and amplification.

Figure 1:
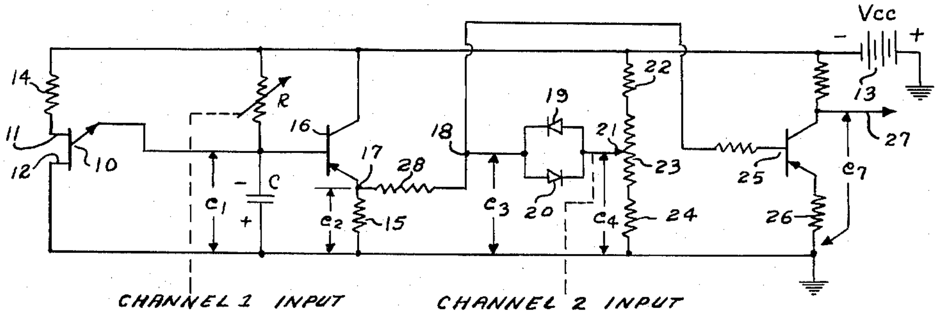
Figure 2:
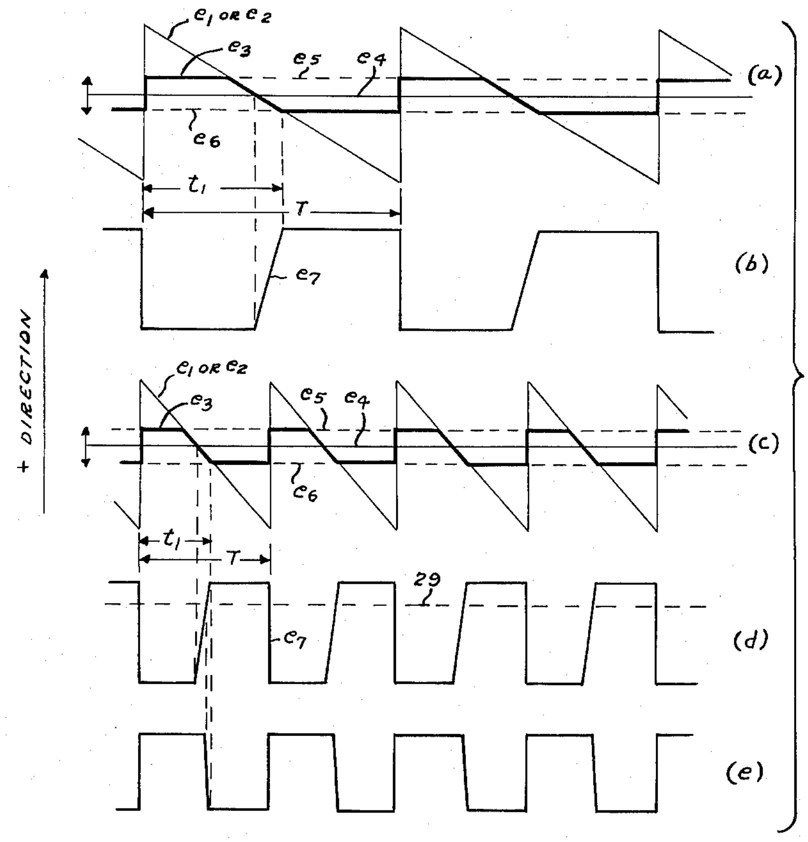

The invention will be explained in detail with reference to the specific embodiment thereof shown in the accompanying drawing in which FIG. 1 is a schematic diagram of the pulse wave generator, and FIG. 2 gives certain of the waveforms developed in the circuit of FIG. 1.

Referring to FIG. 1 the variable resistor R, the capacitor C and the unijunction or double base transistor 10 constitute a sawtooth voltage wave generator, the wave appearing across capacitor C. As well understood in the art, a unijunction transistor is a three-terminal device comprising a base in the form of a bar of n-type or p-type semiconductive material having ohmic or nonrectifying contacts 11 and 12 at each end and a p-n or n-p emitter-base junction located between the base contacts. The unijunction transistor shown in FIG. 1 has a p-type base and an n-p emitter-base junction. Voltage from direct current source 13 is applied across the base contacts 11–12 through resistor 14 establishing a potential gradient in the base. Assuming C to be completely discharged, or $e_1=0$, the n-p emitter-base junction is reverse biased since the base at the junction is negative relative to the emitter. However, as C charges from source 13 through R the emitter falls in potential until it eventually drops below base potential causing an emitter current to flow and C to discharge through the emitter-base junction. This discharge is very rapid due to the negative resistance characteristic that the emitter has after forward conduction has been initiated. After C has discharged the reversed biasing of the emitter-base junction is re-established and the capacitor recharges through R in a new cycle of operation. The sawtooth of voltage $e_1$ across C is as shown at (a) in FIG. 2. The frequency of the wave is determined by the value of R which controls the rate at which C charges and hence the slope of the sawtooth. Changing R has no effect upon the amplitude of the sawtooth wave.

The voltage wave $e_1$ across C is reproduced across the emitter resistor 15 of transistor 16 connected as an emitter follower. The emitter follower stage presents a high impedance to the sawtooth wave generator and faithfully duplicates the waveform $e_1$ as waveform $e_2$ across resistor 15. The voltage $e_2$ can therefore be represented by the same waveform as $e_1$ at (a) in FIG. 2.

The sawtooth wave $e_2$ is applied to a limiting network the input terminals of which are terminal 17 and ground and the output terminals of which are terminal 18 and ground. This network comprises a series resistance element 28 and a shunt element consisting of a pair of oppositely poled parallel connected diodes 19 and 20 which are connected between output terminal 18 and an adjustable tap 21 on a potentiometer composed of resistors 22, 23 and 24. Diodes 19 and 20 have the characteristic that substantially no forward current flows until the forward voltage reaches a value of about 0.5 volt. In other words, the diode has a high forward impedance until a forward potential of about 0.5 volt is reached at which point there is a rapid change to a low impedance, giving the forward characteristic of the diode a definite bend or knee in the vicinity of 0.5 volt. Silicon diode IN3605 is an example. As a result with a sufficiently high value for series resistor 28, the sawtooth wave $e_2$ can not cause the potential $e_3$ of point 18 to rise appreciably above a maximum value 0.5 volt higher than potential $e_4$ of contact 21 or fall appreciably below a minimum value 0.5 volt lower than $e_4$.

Therefore, the above-described clamping actions of diodes 19 and 20 cause a slice to be taken from the sawtooth wave $e_2$ as shown by waveform $e_3$ at (a) in FIG. 2. The line $e_5$, which is always 0.5 volt above $e_4$, represents the upper limit of $e_3$ and line $e_6$, which is always 0.5 volt below $e_4$, represents the lower limit of $e_3$ as established by the diodes. The oscillations of $e_3$ between these limits constitute the desired pulse wave in its initial form. It will be apparent that changing the value of $e_4$ by adjustment of tap 21 changes the vertical position of the slice in the sawtooth wave and thereby varies the duration $t_1$ of the positive-going portion of the wave. Consequently, the duty cycle, or the ratio of $t_1$ to the wave period T may be changed independently of the frequency by adjustment of tap 21.

As stated earlier, the frequency $1/T$ may be changed by changing the value of R which determines the charging rate of capacitor C. This has no effect on the duty cycle $t_1/T$ as may be seen at (c) in FIG. 2. Here the frequency has been doubled but the ratio $t_1/T$ remains the same as at (a) in FIG. 2.

Since T and $t_1/T$ are independently variable, the circuit of FIG. 1 is capable of sending two channels of information without cross talk between channels. The input to channel 1 may be any means for changing R in accordance with the channel 1 information and the input to channel 2 any means for changing $e_4$ in accordance with the channel 2 information. For example, these inputs may be shaft rotations controlling a rheostat in the case of R and controlling the position of tap 21 on a circular potentiometer in the case of $e_4$.

The waveform $e_3$ may be shaped to rectangular form if desired by clipping and amplifying in conventional manner. A certain amount of shaping is accompanied by the stage containing transistor 25. For any given value of $e_4$ this transistor automatically adjusts itself to a quiescent state of low emitter and collector currents due principally to the self-biasing produced by resistor 26. Therefore, in the quiescent state the collector voltage is not too far above —$Vcc$. Any significant increase of $e_3$ above $e_4$ therefore substantially cuts off the emitter and collector currents so that the collector voltage is very nearly equal to —$Vcc$. As $e_3$ falls from its maximum value $e_5$ emitter and collector currents begin to flow as $e_3$ nears $e_4$ and continue to increase until $e_3$ has fallen to $e_6$ causing a corresponding rise in collector potential as shown by waveform $e_7$ at (b) and (d) in FIG. 2. This waveform, which is the output waveform on conductor 27, is inverted in polarity relative to $e_3$ and is more nearly rectangular. A further improvement may be had by additional clipping and amplification of the wave by apparatus (not shown) connected to output line 27. For example, if waveform $e_7$ at (d) in FIG. 2 is clipped so as to remove all of the wave below level 29 and then amplified and inverted, the waveform at (e) results.

While the specific circuit shown in FIG. 1 uses PNP transistors and a unijunction transistor having a p-type base, NPN transistors and a unijunction transistor with an n-type base could also have been used. This would require a reversal of the polarity of direct current supply source 13.

I claim:

A pulse wave generator for use as a transmitter providing two independent information transmission channels over a single transmission path, said generator comprising: means providing first and second conductors having a fixed direct voltage therebetween; a resistor variable in value as an analog of the information to be transmitted over one of said channels, one end of said resistor being connected to said first conductor and the other end being connected through a capacitor to said second conductor, and a unijunction transistor having two base terminals and an emitter terminal, one of said base terminals being connected to said first conductor, the other base terminal being connected to said second conductor and the emitter terminal being connected to the junction of said variable resistor and said capacitor, whereby a constant amplitude sawtooth voltage wave is generated across said capacitor the frequency of which depends upon the instantaneous value of said variable resistor; a limiting network having an input terminal and an output terminal, a resistor connected between said input and output terminals, an adjustable potential divider connected between said first and second conductors providing a point of reference potential relative to said second conductor the value of which reference potential is variable as an analog of the information to be transmitted over the other of said channels, and a pair of parallel connected oppositely poled semiconductor diodes connected between said output terminal and said point of reference potential, said diodes being alike and of the type having a high impedance for forward potentials below a certain value and a low impedance for forward potentials above this value; means coupled between said capacitor and said limiting network for applying said sawtooth wave between the input terminal of said limiting network and said second conductor; a transistor having its collector connected through a collector resistor to said first conductor, its emitter connected through an emitter resistor to said second conductor and its base connected to the output terminal of said limiting network, whereby the waveform appearing at the output terminal of the limiting network is clipped by the process of emitter cutoff and amplified, resulting in a substantially rectangular pulse wave appearing between said collector and said second conductor; and an output circuit constituting said single transmission path connected between said collector and said second conductor for receiving said substantially rectangular pulse wave, the repetition rate of said pulse wave being representative of the information in one of said channels and the duty cycle thereof being representative of the information in the other of said channels.

References Cited by the Examiner

UNITED STATES PATENTS

| | | | |
|---|---|---|---|
| 2,207,048 | 7/1940 | Campbell | 328—34 |
| 2,398,097 | 4/1946 | Kent | 328—36 |
| 2,434,936 | 1/1948 | Labin et al. | 332—15 |
| 2,851,604 | 9/1958 | Clapper | 307—88.5 |
| 3,051,905 | 8/1962 | Morris | 328—31 |
| 3,078,377 | 2/1963 | Brunschweiger | 307—88.5 |
| 3,136,961 | 6/1964 | Schraivogel | 328—36 |
| 3,149,293 | 9/1964 | Farkas | 331—111 |

OTHER REFERENCES

Grimm, German printed application No. S–29405, 9–1955.

ROY LAKE, *Primary Examiner.*

JOHN KOMINSKI, *Examiner.*